(12) United States Patent
Perner et al.

(10) Patent No.: US 7,535,754 B2
(45) Date of Patent: May 19, 2009

(54) INTEGRATED CIRCUIT MEMORY DEVICES WITH MRAM VOLTAGE DIVIDER STRINGS THEREIN

(75) Inventors: Frederick A. Perner, Santa Barbara, CA (US); Kenneth J. Eldredge, Boise, ID (US)

(73) Assignee: Samsung Electronics Co., Inc. (KR)

( * ) Notice: Subject to any disclaimer, the term of this patent is extended or adjusted under 35 U.S.C. 154(b) by 480 days.

(21) Appl. No.: 11/264,539

(22) Filed: Nov. 1, 2005

(65) Prior Publication Data

US 2007/0097733 A1   May 3, 2007

(51) Int. Cl.
 *G11C 11/00*   (2006.01)
(52) U.S. Cl. .................. 365/158; 365/171; 365/173
(58) Field of Classification Search .......... 365/158, 365/171, 173
See application file for complete search history.

(56) References Cited

U.S. PATENT DOCUMENTS

| | | | |
|---|---|---|---|
| 6,865,108 B2 | 3/2005 | Smith et al. | |
| 6,958,933 B2 * | 10/2005 | Smith et al. | 365/171 |
| 7,102,917 B2 * | 9/2006 | Perner | 365/158 |
| 2005/0007816 A1 | 1/2005 | Smith et al. | |
| 2005/0007823 A1 | 1/2005 | Smith et al. | |
| 2005/0007829 A1 | 1/2005 | Perner et al. | |
| 2005/0007830 A1 | 1/2005 | Pernet et al. | |
| 2006/0039191 A1 | 2/2006 | Perner et al. | |
| 2006/0050552 A1 * | 3/2006 | Perner | 365/171 |

* cited by examiner

*Primary Examiner*—Tuan T. Nguyen
*Assistant Examiner*—Hien Nguyen
(74) *Attorney, Agent, or Firm*—Myers Bigel Sibley & Sajovec

(57) ABSTRACT

A memory device and method of reading the memory device is disclosed. The memory device includes a first string of MRAM cells and a second string of MRAM cells. The first string of MRAM cells include a plurality of MRAM cells connected in series and the second string of MRAM cells include another plurality of MRAM cells connected in series. A common connection is controllably connectable to one end of the first string of MRAM cells, and to one end of the second string of MRAM cells.

11 Claims, 9 Drawing Sheets

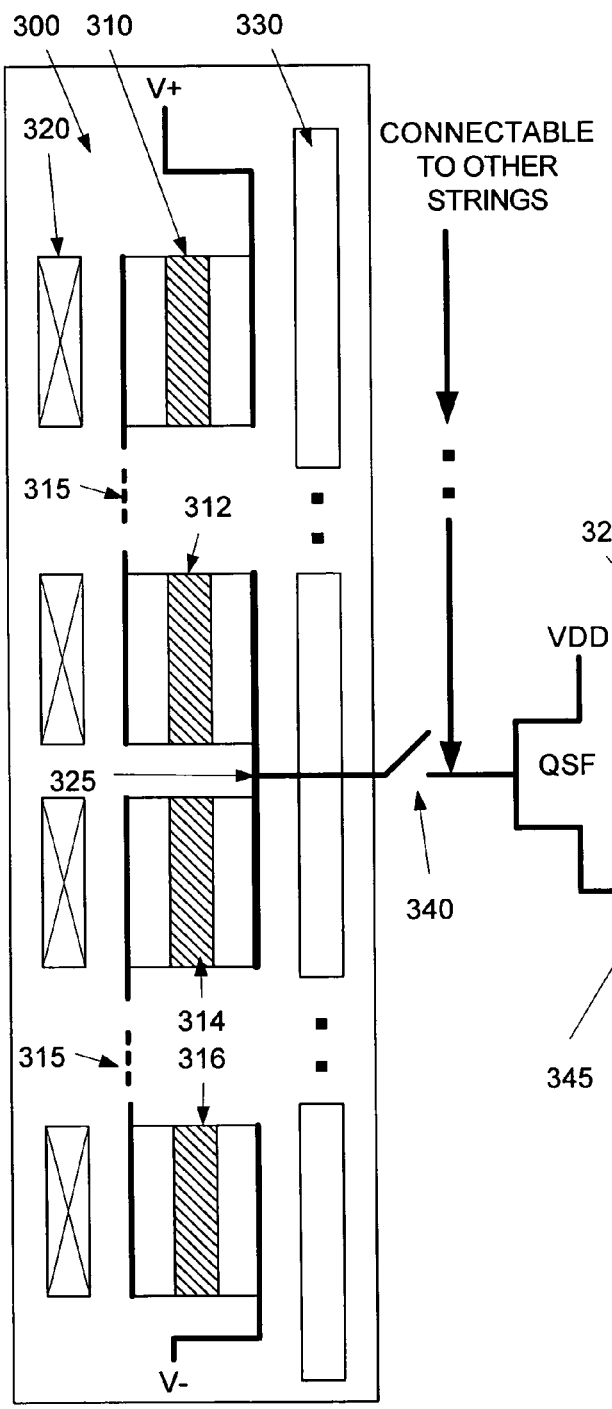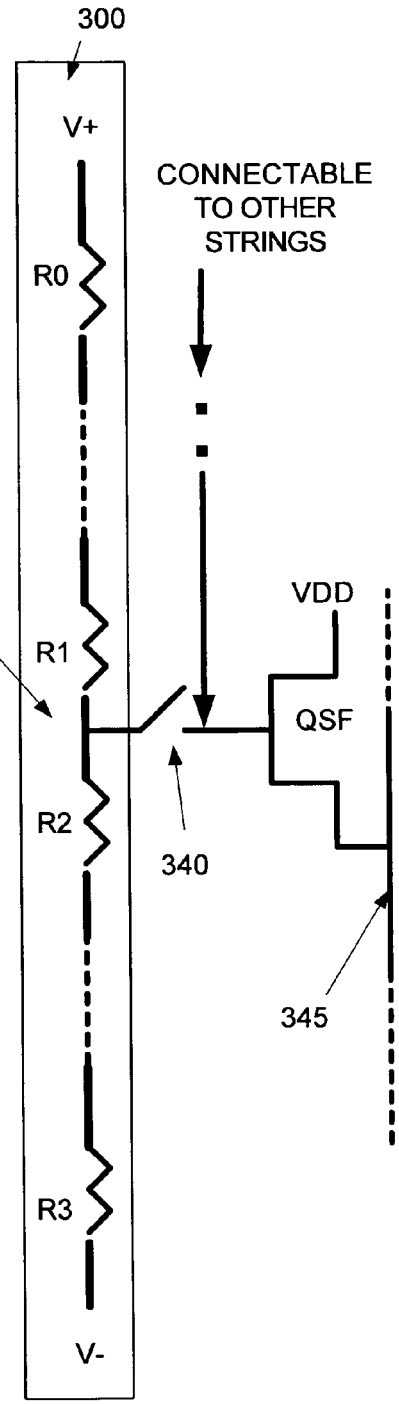
FIGURE 3A
FIGURE 3B

```
┌─────────────────────────────────────────────────────────────────────────────┐
│ Electrically connecting a voltage divider center point of the one of the plurality of strings of │
│              MRAM cells that includes selected MRAM cell, to a read line                         │
│                                      910                                                         │
└─────────────────────────────────────────────────────────────────────────────┘
                                        ▼
┌─────────────────────────────────────────────────────────────────────────────┐
│ Applying a first voltage potential to a first string of MRAM cells, and a second voltage to a   │
│                            second string of MRAM cells                                           │
│                                      920                                                         │
└─────────────────────────────────────────────────────────────────────────────┘
                                        ▼
┌─────────────────────────────────────────────────────────────────────────────┐
│ Sensing through the read line connected to the voltage divider center point, an initial state   │
│                              of the MRAM cell                                                    │
│                                      930                                                         │
└─────────────────────────────────────────────────────────────────────────────┘
                                        ▼
┌─────────────────────────────────────────────────────────────────────────────┐
│                      Writing a known state to the MRAM cell                                      │
│                                      940                                                         │
└─────────────────────────────────────────────────────────────────────────────┘
                                        ▼
┌─────────────────────────────────────────────────────────────────────────────┐
│                 Sensing through the read line, the known state of the MRAM cell                  │
│                                      950                                                         │
└─────────────────────────────────────────────────────────────────────────────┘
                                        ▼
┌─────────────────────────────────────────────────────────────────────────────┐
│ Determining the state of the MRAM cell by comparing the sensed initial state the MRAM           │
│                     cell with the sensed known state of the MRAM cell                            │
│                                      960                                                         │
└─────────────────────────────────────────────────────────────────────────────┘
                                        ▼
┌─────────────────────────────────────────────────────────────────────────────┐
│         Writing back the sensed initial state of the MRAM cell, restoring its initial state      │
│                                      970                                                         │
└─────────────────────────────────────────────────────────────────────────────┘
```

FIGURE 9

INTEGRATED CIRCUIT MEMORY DEVICES WITH MRAM VOLTAGE DIVIDER STRINGS THEREIN

FIELD OF THE INVENTION

The invention relates generally to electronic memory. More particularly, the invention relates to reading MRAM cells located within strings of MRAM cells.

BACKGROUND OF THE INVENTION

Magnetic Random Access Memory ("MRAM") is a non-volatile memory. MRAM devices may perform read and write operations faster than conventional long term storage devices such as hard drives. In addition, MRAM devices may be more compact and may consume less power than conventional storage devices.

A typical MRAM device includes an array of memory cells in which word lines extend along rows of the memory cells and bit lines extend along columns of the memory cells. Each memory cell is typically located at a cross point of a word line and a bit line.

A memory cell in an MRAM device stores a bit of information according to an orientation of a magnetization of layer within the MRAM device. The magnetization of a memory cell assumes one of two stable orientations at a given time. The two orientations are typically referred to as parallel and anti-parallel and represent logic level values of '0' and '1', respectively.

The magnetization orientation affects the resistance of the memory cell such as a spin dependent tunneling junction device. For instance, the resistance of a memory cell is a first value if the magnetization orientation is parallel, the resistance of the memory cell is increased to a second value if the magnetization orientation changed from parallel to anti-parallel. The magnetization orientation of a selected memory cell, and therefore the logic state of the memory cell, may be read by determining the resistance state of the selected memory cell.

One of the challenges with MRAM devices involves electrically isolating the circuits that comprise the memory cells while maintaining a sufficient level of packing density. Although additional components such as transistors may be used to increase the isolation of memory cells, an increase in the number of components typically results in a decrease in the packing density of the memory cells, i.e., the number of memory cells per a given area, and a decrease in the packing density generally results in increased costs.

It is desirable to be able to increase packing densities while increasing the electrical isolation of memory cells. It is also desirable to maintain reliability of sensing states of the memory cells.

SUMMARY OF THE INVENTION

One exemplary embodiment includes a memory device. The memory device includes a first string of MRAM cells and a second string of MRAM cells. The first string of MRAM cells include a plurality of MRAM cells connected in series and the second string of MRAM cells include another plurality of MRAM cells connected in series. A common connection is controllably connectable to one end of the first string of MRAM cells, and to one end of the second string of MRAM cells.

Another exemplary embodiment includes a method of reading a state of an MRAM cell, wherein the MRAM cell is included within one of a plurality of strings of MRAM cells. The method includes electrically connecting a voltage divider string center point of the plurality of strings of MRAM cells that includes the MRAM cell to a read line. A first voltage potential to is applied a first string of MRAM cells, and a second voltage is applied to a second string of MRAM cells. An initial state of the MRAM cell is sensed through the read line connected to the voltage divider string center point. A known state is written to the MRAM cell. The known state of the MRAM cell is sensed through the read line. The state of the MRAM cell is determined by comparing the sensed initial state the MRAM cell with the sensed known state of the MRAM cell. The read operation is completed by writing back the initial state of the MRAM cell.

Other aspects and advantages of the present invention will become apparent from the following detailed description, taken in conjunction with the accompanying drawings, illustrating by way of example the principles of the invention.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 3A is shows an embodiment of a first system for reading a memory cell in a voltage divider string.

FIG. 3B is a circuit schematic of the first system for reading a memory cell in a voltage divider string.

FIG. 9 is a flow chart showing steps included within a method of reading an MRAM cell.

DETAILED DESCRIPTION

Figure 1:
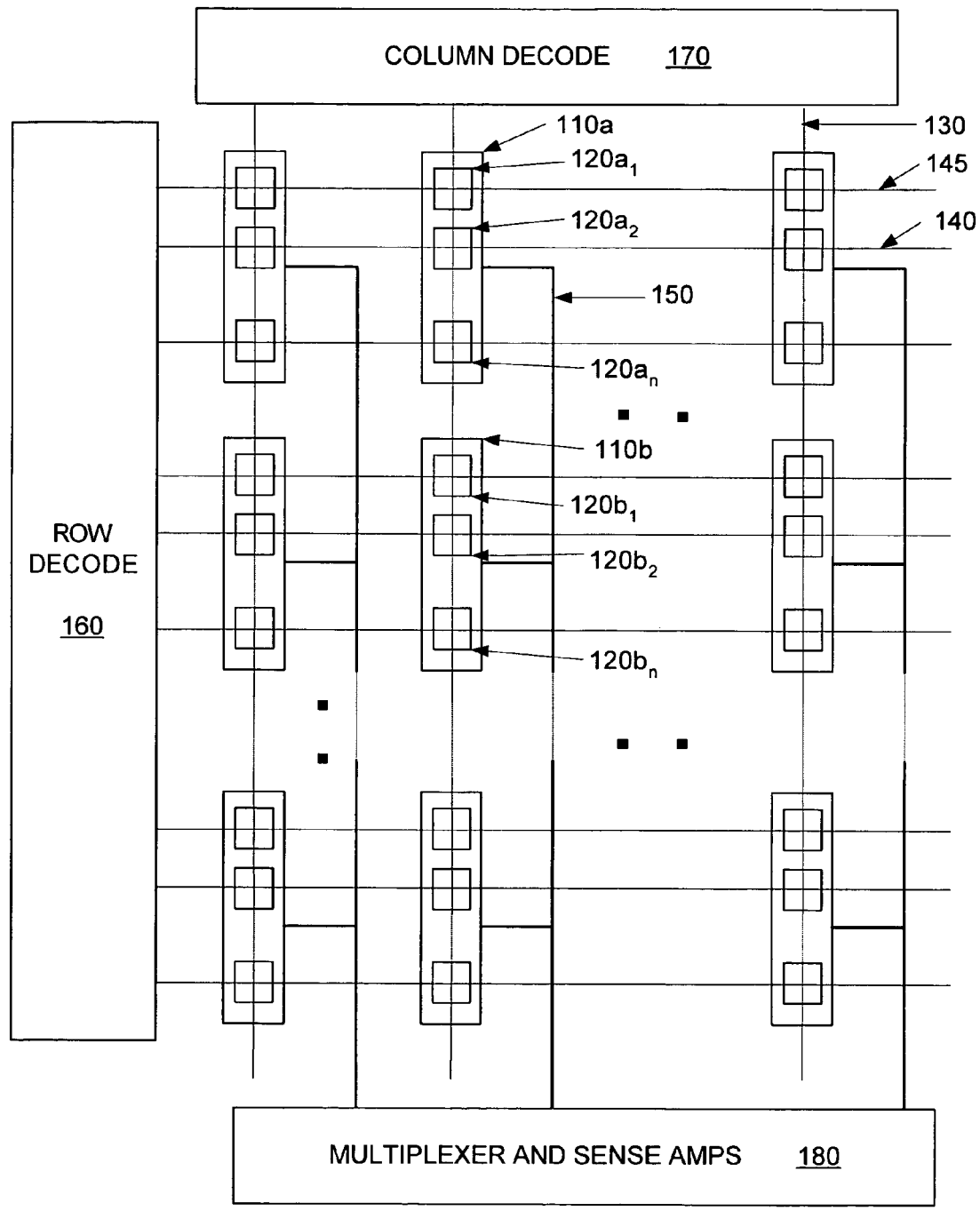
FIG. 1 is shows an embodiment of a data storage device that includes voltage divider strings.

As shown in the drawings for purposes of illustration, the present invention is embodied in an MRAM device. The MRAM device includes an array of memory cells and circuitry for reliably sensing resistance states of the memory cells. The array of memory cells is divided into voltage divider strings. To read a memory cell in a voltage divider string, the output of a controllably connectable voltage divider circuit is determined before and after the memory cell is written to a first state using a voltage. If the voltage divider output does not change after being written to the first state, then the memory cell was in the first state prior to being written to the first state. If the voltage divider output changes after being written to the first state, then the memory cell was in a second state prior to being written to the first state. In this case, the memory cell is written back to the second state. Configuring the memory cells into strings in which states of the memory cells are sensed by a voltage divider circuit provides for a reduction in the number of sense line connections. The voltage divider strings are adaptive for being formed in stacked layers. Adding multiple layers of MRAM memory cells increases the memory storage density of an MRAM chip without decreasing the feature size of the chip. For example, adding an additional layer of MRAM memory cells to a single-layer chip doubles the memory capacity. The memory density of the MRAM chip is effectively doubled without increasing the chip area or shrinking the feature size.

FIG. 1 shows an exemplary MRAM memory system. The memory system includes an array of voltage divider strings 110. As will be described, each voltage divider string includes a first string of memory cells and a second string of memory cells, in which a center point of each voltage divider string is determined by a point of connection of the first string and the second string. Each voltage divider string 110 includes two or more memory cells 120. For example, a first voltage divider string 110a includes memory cells $120a_1$, $120a_2$, $120a_n$ and a second voltage divider string 110b includes memory cells $120b_1$, $120b_2$, $120b_n$.

A horizontal write word line 140, horizontal read control line 145 and a vertical write bit line 130 cross each memory cell 120. A row decoder 160 drives write word lines 140 and horizontal read control lines 145, and a column decoder 170 drives write bit lines 130. Each voltage divider string 110 has a voltage divider output connected to a bit sense line 150. A single bit-sense line 150 is selected by a multiplexer/sense amplifier unit 180. In the illustrated example, memory system 100 uses binary address decoding and illustrates the data storage.

While the center point of the voltage divider string may preferably be located at the exact center (that is, between equal numbers of memory cells), the center point can be located off-center as well. Locating the center point at the exact center of the voltage divider string provides the most tolerance to nominal resistance imbalances between MRAM cells, and is tolerant of shorted cells. Locating the center point off-center of the voltage divider string reduces the tolerance to resistive imbalances of the MRAM cells, and to short elements.

The memory system includes any number of memory cells 120, and any number of voltage divider strings 110. Writing to individual memory cells 120 is performed by selecting corresponding write word lines 140 by the row decoder 160, and selecting corresponding write bit lines 130 by the column decoder 170. Reading a particular memory cell 120 require setting select corresponding switches (as will be described) connecting the voltage divider string 110 of the memory cell to a read bit line 150. The state of the memory cell is sensed by the multiplexer and sense amplifier circuits 180.

When an active word line 140 and an active bit line 130 cross a memory cell 120, the memory cell magnetization direction changes according to the direction of current flow in bit line 130 and/or the word line 140, and a bit is written. The direction of the magnetization of memory cell 120 affects its resistance and the resistance of an individual memory cell 120 affects the voltage output from its associated voltage divider string 110. The voltage output from the voltage divider string represents the content of the data written.

A controller writes a known state, that is, either a logical 1 or 0, into memory cells 120. Then, as previously described, a second voltage is read from the selected row and routed through multiplexer and sense amplifier 180 where controller then causes a sense amplifier to compare the second voltage with the stored first voltage. In one implementation, the output of sense amplifier indicates with a logical 1 that the stored first voltage is different from the second voltage resulting from writing a known state to memory cell 120. For example, if the known logical state written to memory cell 120 is a logical 0, then the output of sense amplifier will contain a logical 1 if the stored first voltage is different from the second voltage or a logical 0 if the stored first voltage and second voltage are essentially the same. Put alternatively, the output of sense amplifier contains the data that was in memory cell 120 before it was written with the known logical state.

Figures 2A, 2B:
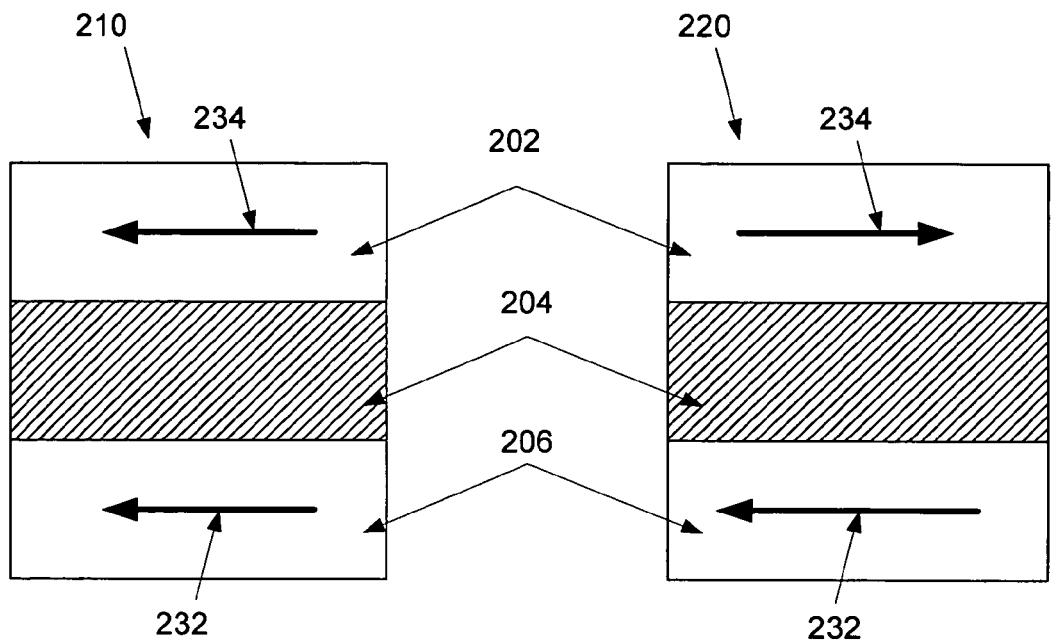
FIG. 2A is shows an embodiment of a parallel magnetization orientation of an MRAM memory cell.
FIG. 2B is shows an embodiment of an anti-parallel magnetization orientation of an MRAM memory cell.

FIG. 2A shows a magneto-resistive memory cell 210 in a parallel state. The memory cell 210 includes an insulating tunnel barrier 204 sandwiched between a pinned magnetic layer 206 and a free magnetic layer 202. Alternatively, the pinned layer 206 may be substituted instead with what is referred to as a reference layer. In an alternate implementation, an MRAM structure uses a soft reference layer rather than pinned magnetic layer 210. The alignment 232 of the magnetization of the soft reference layer 202 is established when a current is applied to either the selected row or selected column. The magnitude of the applied current is large enough to establish a reference magnetization in the soft reference layer but small enough to not disturb data in the free layers. The advantage of using the soft reference layer is the data may be sensed without writing or toggling the free layer as part of a multi-sample read. Implementations of the present invention work well with either a pinned or soft reference layer.

Insulating tunnel barrier 204 has a resistance that is a function of the relative magnetization orientations of pinned magnetic layer 206 and free magnetic layer 202. Pinned magnetic layer 206 is termed "pinned" because its magnetization is oriented 232 in a plane and fixed so as to not rotate in the presence of an applied magnetic field below a predetermined level. The free magnetic layer 202 is termed "free" because its magnetization can be readily oriented 234 in one of two directions along a preferred magnetic axis often termed the "easy" axis. Since free magnetic layer 202 and pinned magnetic layer 208 have the same magnetic orientations, cell 210 is termed to be in the "parallel" state.

FIG. 2B shows another magneto-resistive memory cell 220 in an anti-parallel state in accordance with one implementation of the present invention. The state of memory cell 220 is termed "anti-parallel" because the magnetic orientation 234 of free magnetic layer 202 is different from the magnetic orientation of pinned magnetic layer 206.

Insulating tunnel barrier 204 separates free magnetic layer 202 and pinned magnetic layer 206. Because insulating tunnel barrier 204 is extremely thin, quantum mechanical tunneling occurs occur between free magnetic layer 202 and pinned magnetic layer 206. This tunneling phenomenon results in an apparent resistance between the free magnetic layer 202 and pinned magnetic layer 206. Further, the tunneling phenomenon is electron spin dependent so the resistance of insulating tunnel barrier 204 is a flnction of the relative magnetic orientations of free magnetic layer 202 and pinned magnetic layer 206. In general, the anti-parallel state has a higher resistance than the parallel state.

A single bit of information is stored in a memory cell by causing the relative orientation of free magnetic layer 202 to be either parallel or anti-parallel. For example, parallel could indicate the storage of a logical 1 and anti-parallel could indicate the storage of a logical 0, or vice versa. The memory cell is non-volatile because its free magnetic layer 202 and pinned magnetic layer 206 retain their relative magnetic orientation when power is removed.

Figure 2C:
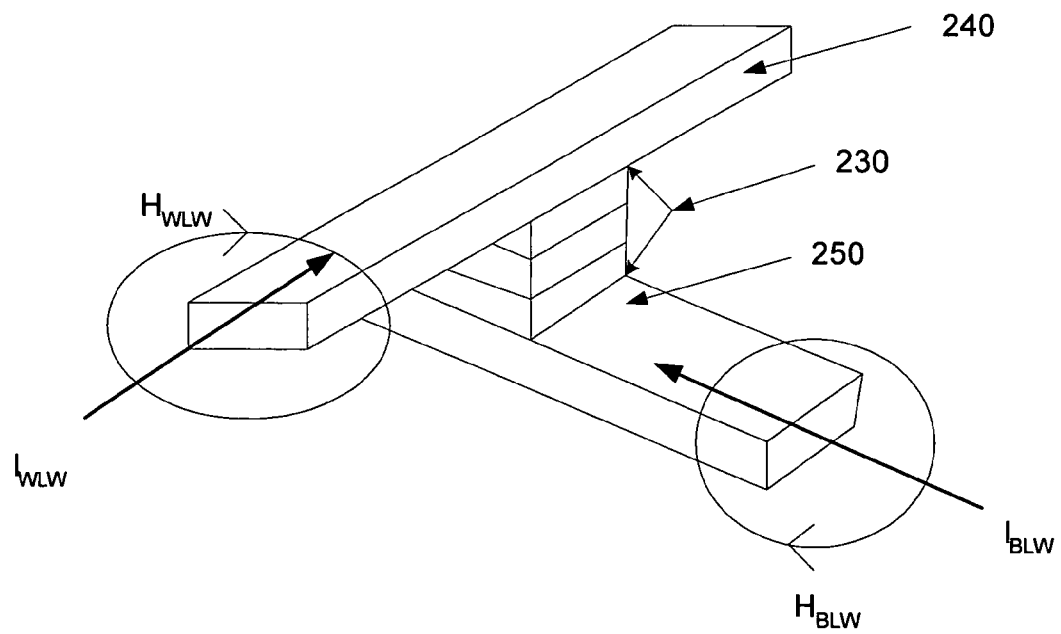
FIG. 2C shows an embodiment for writing to an MRAM memory cell.

FIG. 2C is a diagram of a write operation to a magneto-resistive memory cell 230. The memory cell 230 is crossed at substantially right angles by a write word line 240 and a write bit line 250. Orienting the free magnetic layer of memory cell 230 to either the parallel or anti-parallel state is determined by a write operation. The magnetization of the free magnetic layer of selected memory cell 230 is oriented by applying a write word line current $I_{WWL}$ to the word line 240 and a write bit line current $I_{WBL}$ to the bit line 250 that are both coincident with memory cell 230.

A magnetic field $H_{WLW}$ is associated with the current $I_{WLW}$ flowing in write word line 240. Similarly, a magnetic field $H_{BLW}$ is associated with the current $I_{BLW}$ flowing in write bit line 250. When current $I_{WLW}$ and current $I_{BLW}$ are of a predetermined magnitude, the combination of their respective magnetic fields $H_{WLW}$ and $H_{BLW}$ cause the magnetic orientation of free magnetic layer to rotate from parallel to anti-parallel or vice versa. The current magnitudes are selected so that their combined magnetic field is able to rotate the magnetic orientation of the free magnetic layer in selected memory cell 230 without disturbing the corresponding magnetic orientation of the pinned magnetic layer.

FIG. 3A shows a voltage divider string 300. The voltage divider string 300 includes memory cells 310, 312, 314, 316 connected in series by metallization links 315 to form a voltage divider between voltage sources V+ and V−. As will be described later, the voltage divider string 300 includes a first string which defines one side of the voltage divider, and a second string that defines the other side of the voltage divider. Some configurations include the voltage sources being switched. That is, some embodiments of the strings of MRAM cells require the voltages sources to be asserted (switched) only when reading a memory cell within the series of memory cells. The previously described read control lines 145 can control the voltage sources V+, V−. Other embodiments do not require the voltage sources V+ and V− to be switched. Some embodiments include either of the voltage source V+, V− being a ground potential.

Each memory cell 310 is crossed at approximately right angles by a vertical write bit line 330 and a horizontal write word line 320. Junction 325, located at the midpoint of the series of memory cells 310, is controllably connectable through a switch 340 to the gate of transistor QSF. The switch 340 provides isolation between the voltage divider string, and other voltage divider strings (not shown). The other voltage divider strings also include switches equivalent to the switch 340. The inclusion of these switches (like switch 340) provides isolation between the voltage divider strings. Without these switches, the voltage divider strings would be all connected together, which would greatly reduce the signal swing present on the junction 325 for the different memory cell states of the memory cells within the voltage divider strings.

The transistor QSF can be configured as a source follower. The drain of transistor QSF is connected to voltage source VDD while the source of transistor QSF is connected to read bit sense line 345. The transistor operates as a voltage follower or source follower when reading or sensing a state of a memory cell. Other configurations of this circuit to sense the voltage on node junction 325 can be implemented.

As previously described, memory cell 310 includes insulating tunneling barrier 204 sandwiched between pinned magnetic layer 206 and free magnetic layer 202. The resistance of the insulating tunneling barrier 204 is a function of the orientation of the magnetization of free magnetic layer 202. Electrically, memory cell 310 can be modeled as a resistor with resistance in which pinned magnetic layer 206 and free magnetic layer 202 each forms a terminal of the resistor.

The voltage divider is formed by connecting pinned magnetic layer 206 of a first memory cell, to the switched voltage source V+ and connecting free magnetic layer 202 of the first cell to free magnetic layer 202 of a second, adjacent cell. The pinned magnetic layer 206 of the second cell is connected to pinned magnetic layer 206 of a third cell, adjacent to the second cell. The connection pattern is repeated until a final cell is reached, whereupon pinned magnetic layer 206 of the final cell is connected to the voltage source V−.

FIG. 3B is a schematic diagram illustrating the voltage divider string 300. As previously described, voltage divider string 300 is effectively a string of resistors (R0, R1, R2, R3) that form a voltage divider between switched voltage sources V+ and V−. Each resistor has a resistance that is a function of the magnetic orientation of the free magnetic layer of its associated memory cell. The voltage divider output is taken from its midpoint 325 operatively connected to the gate of transistor QSF, through isolation switch 340. Several are several possible configurations of the switch 340 as will be discussed. The transistor QSF is configured as a source follower. The drain of transistor QSF is connected to $V_{DD}$ and the source is connected to read bit sense line 345. A source follower configured transistor provides extra drive capability necessary for driving the read bit sense line 345.

When any of memory cells 310 associated with voltage divider string 300 are read, the switch 340 is closed. Additionally, the switched voltage sources V+, V− can be turned on (the previously described read control lines 145 can control the voltage sources V+, V−). As previously described, the magnetic orientation of the free magnetic layer associated with each memory cell is a function of the bit stored in the cell. For example, a binary 1 is represented by the orientation to point in one direction along the free magnetic layer's easy axis and a binary 0 is represented by the orientation to point in the opposite direction. There is a different resistance for each orientation. Changing a cell's state changes its resistance, which is reflected as a voltage change at voltage divider midpoint 325. The voltage of the voltage divider midpoint 325 is conveyed by the switch 340, and the source-follower transistor $QS_F$ to bit sense line 345.

Figure 4:
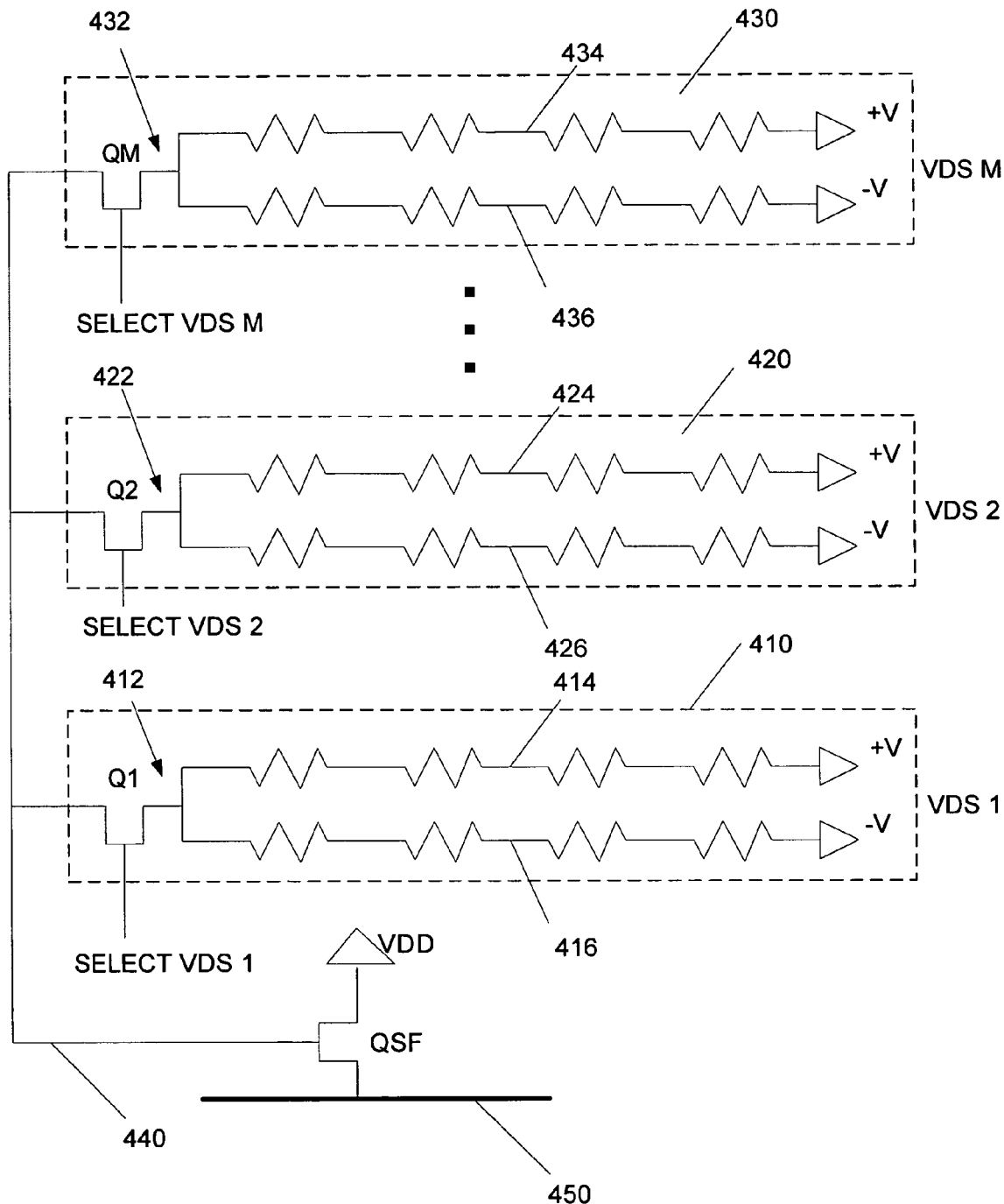
FIG. 4 is shows an embodiment of a second system for reading a memory cell in a voltage divider string.

FIG. 4 is shows an embodiment of another system for reading a memory cell in a memory. This embodiment includes M controllably connectable voltage dividers strings 410, 420, 430. Each of the voltage dividers strings 410, 420, 430 includes two strings (a first string 414, 424, 434 and a second string 416, 426, 436) of MRAM cells (represented as resistive elements) connected in series. Voltage divider center points 412, 422, 432 of the voltage dividers strings 410, 420, 430 are controllably connectable to a common connection 440. The common connection 440 is controllably connectable to a read bit line 450.

As shown, closing a first switch Q1 connects the voltage divider string center point 412 of the two strings (414, 416) of MRAM cells of the first voltage divider string 410 to the common connection 440. Closing a second switch Q2 connects the voltage divider string center point 422 of the two strings (424, 426) of MRAM cells of the second voltage divider string 420 to the common connection 440. Closing the Mth switch QM connects the voltage divider string center point 432 of the two strings (434, 436) of MRAM cells of the Mth voltage divider string 430 to the common connection 440. Inclusion of the switches Q1, Q2, QM provides enhancement of signal levels present on the voltage divider string center points compared to the signal levels if the switches Q1, Q2, QM were not included. That is, an alternative embodiment includes the switches being removed. However, removing the switches leaves all of the voltage divider strings 410, 420, 430 connected in parallel, and reduces the observable signal swing at the voltage divider string center points 412, 422, 432.

Each of the voltage divider strings 410, 420, 430 include a first string (414, 424, 434) of MRAM cells connected to a first voltage potential V+ and controllably connectable to the common connection 440, and a second string (416, 426, 436) of MRAM cells connected to a second voltage potential V− and controllably connectable to the common conductor 440. When the common connection 440 is connected to both the first string and the second string, the common conductor 440 is connected to a voltage divider string center point of the series (first and second string) of MRAM cells. More specifically, the first string (414, 424, 434) of MRAM cells are located on a first side of the voltage divider string center point, and the second string (416, 426, 436) of MRAM cells are located on a second side of the voltage divider string center point. The common conductor 440 is connected to the read bit line 450 when sensing the voltage potential of the voltage divider string center point.

For this embodiment, the voltage supplies V+ and V− can be switched. Note that it is the relative difference between the voltage supplies that is desirable. That is, either could be a ground or other voltage potential, as long as there is a relative difference between the voltage supplies V+, V−.

The switches Q1, Q2, QM may be located in the substrate (the bulk) or located in the same layer as the corresponding voltage divider strings of MRAM cells 410, 420, 430. That is, the voltage divider strings of MRAM cells can be fabricated in layers separate, but proximate to a substrate that includes the memory control circuitry. The switches Q1, Q2, QM can be fabricated in the substrate as well, or the switches Q1, Q2, QM can be fabricated in the corresponding layers of voltage divider strings of MRAM cells 410, 420, 430. Fabricating the switches Q1, Q2, QM in the same layer as the MRAM cells may be more expensive, but may advantageously allow for a smaller foot print because of stacking.

The switches Q1, Q2, QM do not necessarily have to be ideal. That is, the "on" and "off" state resistances of the switches need only be comparatively "low" and "high" resistances relative to the "low" and "high" resistances of the MRAM cells. The "high" resistance state of the switch need only be relatively high with respect to the high resistance state of the MRAM cells, and the low resistance state of the switches only needs to be low relative to the low resistance state of the MRAM cells.

As shown if FIG. 4, the switch Q1 is turned on (closed) by a SELECT VDS (voltage divider string) 1 control line. The switch Q2 is turned on (closed) by a SELECT VDS 2 control line. The switch QM is turned on (closed) by a SELECT VDS M control line. Any number of voltage divider string strings can be included within this embodiment.

Figure 5:
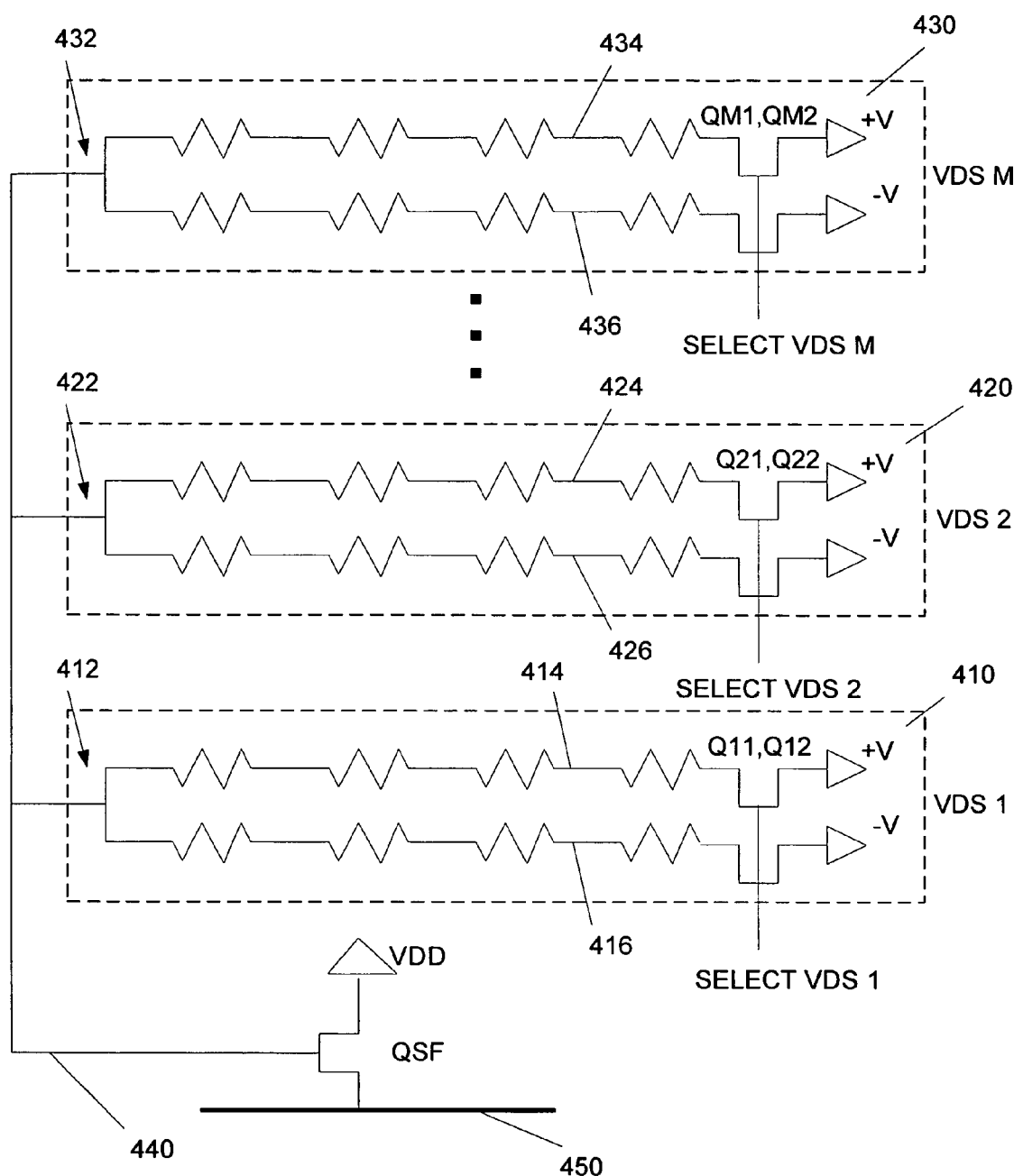
FIG. 5 is shows an embodiment of a third system for reading a memory cell in a voltage divider string.

FIG. 5 is shows an embodiment of another system for reading a memory cell in a voltage divider string. Voltage divider string center points 412, 422, 424 of the strings 510, 520, 530 are controllably connectable to the common connection 440.

The voltage divider string center points 412, 422, 424 are essentially connected to the common connection 440 by pairs of switches. The first voltage divider string center point 412 is controllable connectable to the common connection through a pair of switches Q11, Q12. The switches Q11, Q12 are selected by the SELECT VDS 1 control line. The second voltage divider string center point 422 is controllable connectable to the common connection through a pair of switches Q21, Q22. The switches Q21, Q22 are selected by the SELECT VDS 2 control line. The Mth voltage divider string center point 432 is controllable connectable to the common connection through a pair of switches QM1, QM2. The switches QM1, QM2 are selected by the SELECT VDS M control line.

Figure 6:
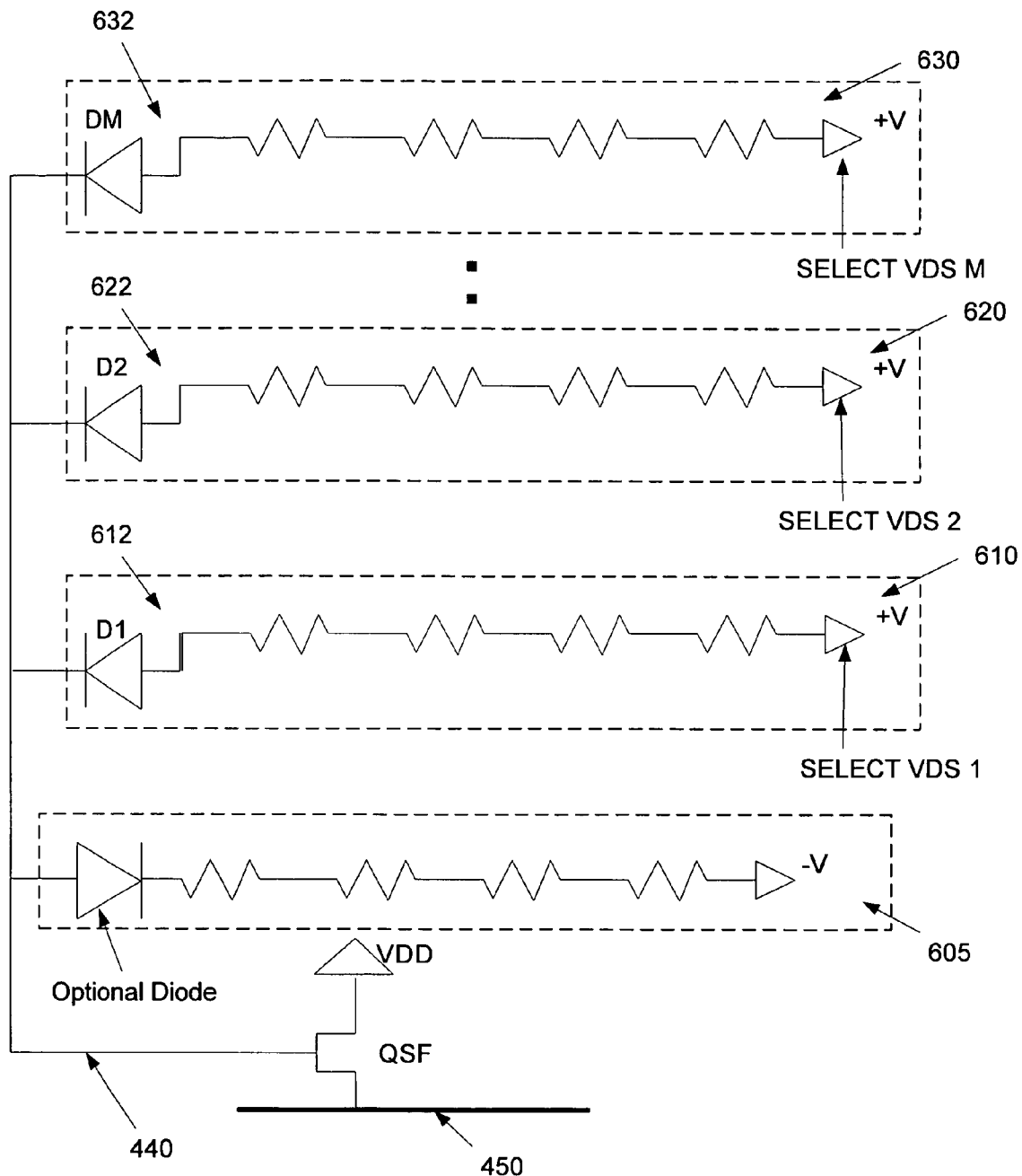
FIG. 6 is shows an embodiment of a fourth system for reading a memory cell in a voltage divider string.

FIG. 6 is shows an embodiment of another system for reading a memory cell in a voltage divider string. This embodiment includes switching diodes rather than switching transistors. In some situations, diodes are more practical to implement. Additionally, thin film diodes are typically less expensive to fabricate than transistors. The switching diodes can be fabricated on the same substrate as the MRAM control circuitry, or the switching diodes can be fabricated on a same layer as a corresponding string of MRAM memory cells.

Voltage divider string center points 612, 622, 632 of each of the MRAM voltage divider strings 610, 620, 630 are controllably connectable to the common connection 440 by forward biasing a corresponding switch diodes D1, D2, DM. A particular one of the switch diodes D1, D2, DM can be selected (turned on) by forward biasing the diode by switching a corresponding voltage supply V+ from a low voltage potential, to a higher voltage potential. The higher voltage potential turns on the diode and effectively connects the associated voltage divider string center point 612, 622, 632 to the common connection 440. All of the non-selected strings of MRAM memory cells are de-activated by setting the corresponding voltage supplies to a lower voltage, so that the corresponding switching diode D1, D2, DM is reverse biased. Note that the switching diodes can also be selected (turned on) by switching a corresponding voltage supply V− from a high voltage potential, to a lower voltage potential, causing the selected diode to be forward biased.

A reference (second) string of MRAM cells 605 provide a "lower" end of the voltage divider string for all of the strings of MRAM cells 610, 620, 630. The reference string of MRAM cells 605 includes the lower voltage potential V−. The reference string of MRAM cells 605 can include a series switching diode (Optional Diode) as well.

The locations of the switching diodes D1, D2, DM within the strings of MRAM memory cells is not really critical. That is, as long as the switching diode D1, D2, DM is located in series with the MRAM cells within the string, and the switching diode D1, D2, DM can be forward biased, the corresponding voltage divider string center point 612, 622, 632 is effectively connected to the common connection 440 when the corresponding voltage supply V+ is switched on.

Figure 7:
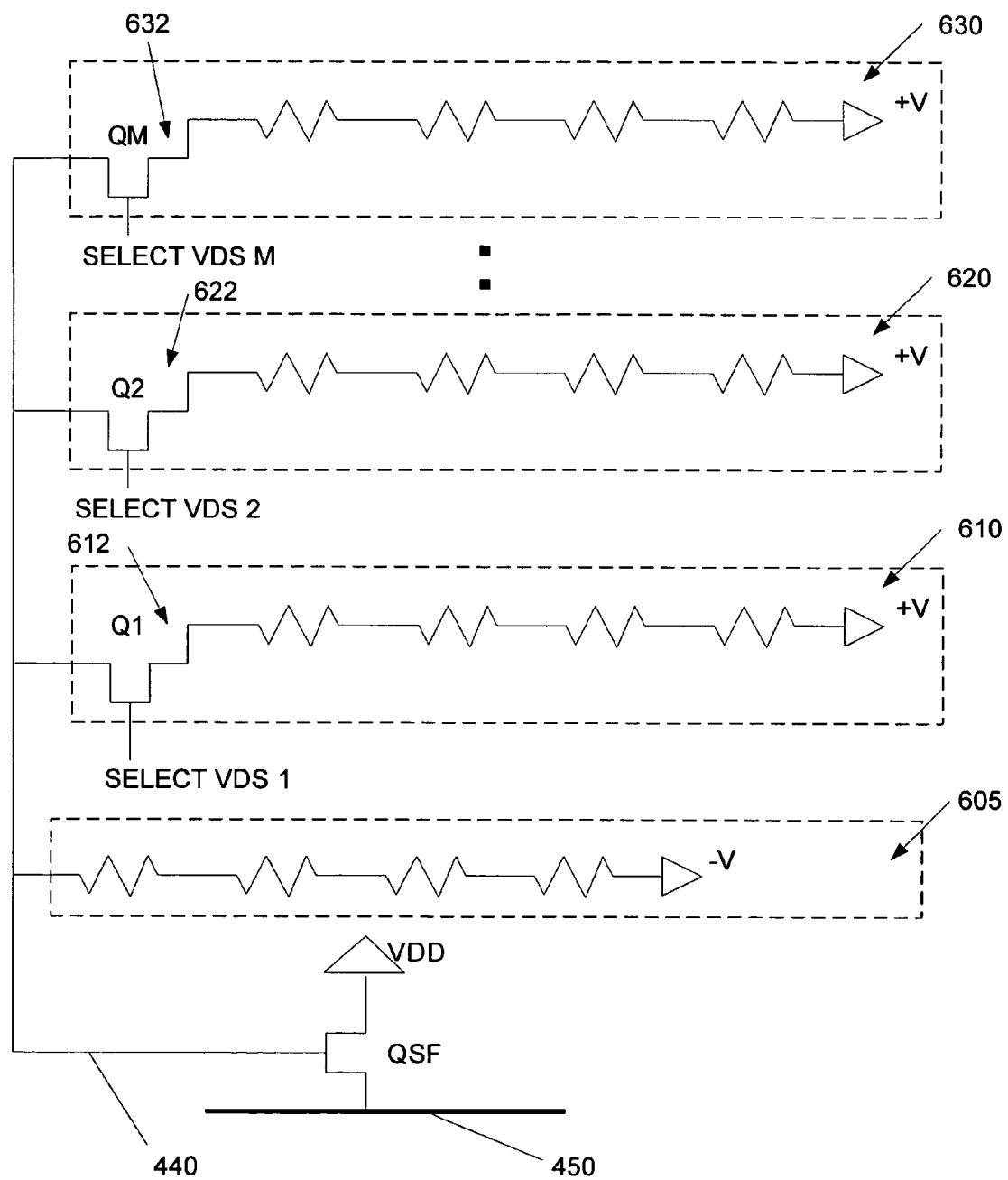
FIG. 7 is shows an embodiment of a fifth system for reading a memory cell in a voltage divider string.

FIG. 7 is shows an embodiment of another system for reading a memory cell in a voltage divider string. This embodiment is similar to the embodiment of FIG. 6, but the switching diodes D1, D2, DM have been replaced by switching transistors Q1, Q2, QM.

This embodiment also includes a reference (second) string of MRAM cells 605 that provide the "lower" voltage potential end of the voltage divider strings. This embodiment includes M controllably connectable voltage divider string 610, 620, 630. Each of the cells 610, 620, 630 includes a string of MRAM cells (represented as resistive elements) connected in series. Voltage divider string center points 612, 622, 632 of the cells 610, 620, 630 are controllably connectable to a common connection 440. The common connection 440 is controllably connectable to a read bit line 450.

As shown, closing a first switch Q1 connects the voltage divider string center point 612 of the string of MRAM cells of the first string of MRAM cells 610 to the common connection 440. Closing a second switch Q2 connects the voltage divider string center point 622 of the string of MRAM cells of the second string of MRAM cells 620 to the common connection 440. Closing the Mth switch QM connects the voltage divider string center point 632 of the string of MRAM cells of the Mth cell 630 to the common connection 440. Inclusion of the switches Q1, Q2, QM provides enhancement of signal levels present on the voltage divider string center points compared to the signal levels if the switches Q1, Q2, QM were not included. That is, an alternative embodiment includes the switches being removed. However, removing the switches leaves all of the strings of MRAM cells 610, 620, 630 connected in parallel, and reduces the observable signal swing at the voltage divider string center points 612, 622, 632.

For this embodiment, the voltage supplies V+ and V− can be switched. Note that it is the relative difference between the voltage supplies that is desirable. That is, either could be a ground or other voltage potential, as long as there is a relative difference between the voltage supplies V+, V−.

The switches Q1, Q2, QM may be located in the substrate (the bulk) or located in the same layer as the corresponding strings of MRAM cells 610, 620, 630. That is, the strings of MRAM cells can be fabricated in layers separate, but proximate to a substrate that includes the memory control circuitry. The switches Q1, Q2, QM can be fabricated in the substrate as well, or the switches Q1, Q2, QM can be fabricated in the corresponding layers of strings of MRAM cells 610, 620, 630. Fabricating the switches Q1, Q2, QM in the same layer as the MRAM cells may be more expensive, but may advantageously allow for a smaller foot print because of stacking.

The switches Q1, Q2, QM do not necessarily have to be ideal. That is, the "on" and "off" state resistances of the switches need only be comparatively "low" and "high" resistances relative to the "low" and "high" resistances of the MRAM cells. The "high" resistance state of the switch need only be relatively high with respect to the high resistance state of the MRAM cells, and the low resistance state of the switches only needs to be low relative to the low resistance state of the MRAM cells.

As shown in FIG. 7, the switch Q1 is turned on (closed) by a SELECT VDS 1 control line. The switch Q2 is turned on (closed) by a SELECT VDS 2 control line. The switch QM is turned on (closed) by a SELECT VDS M control line. Any number of voltage divider strings can be included within this embodiment.

Figure 8:
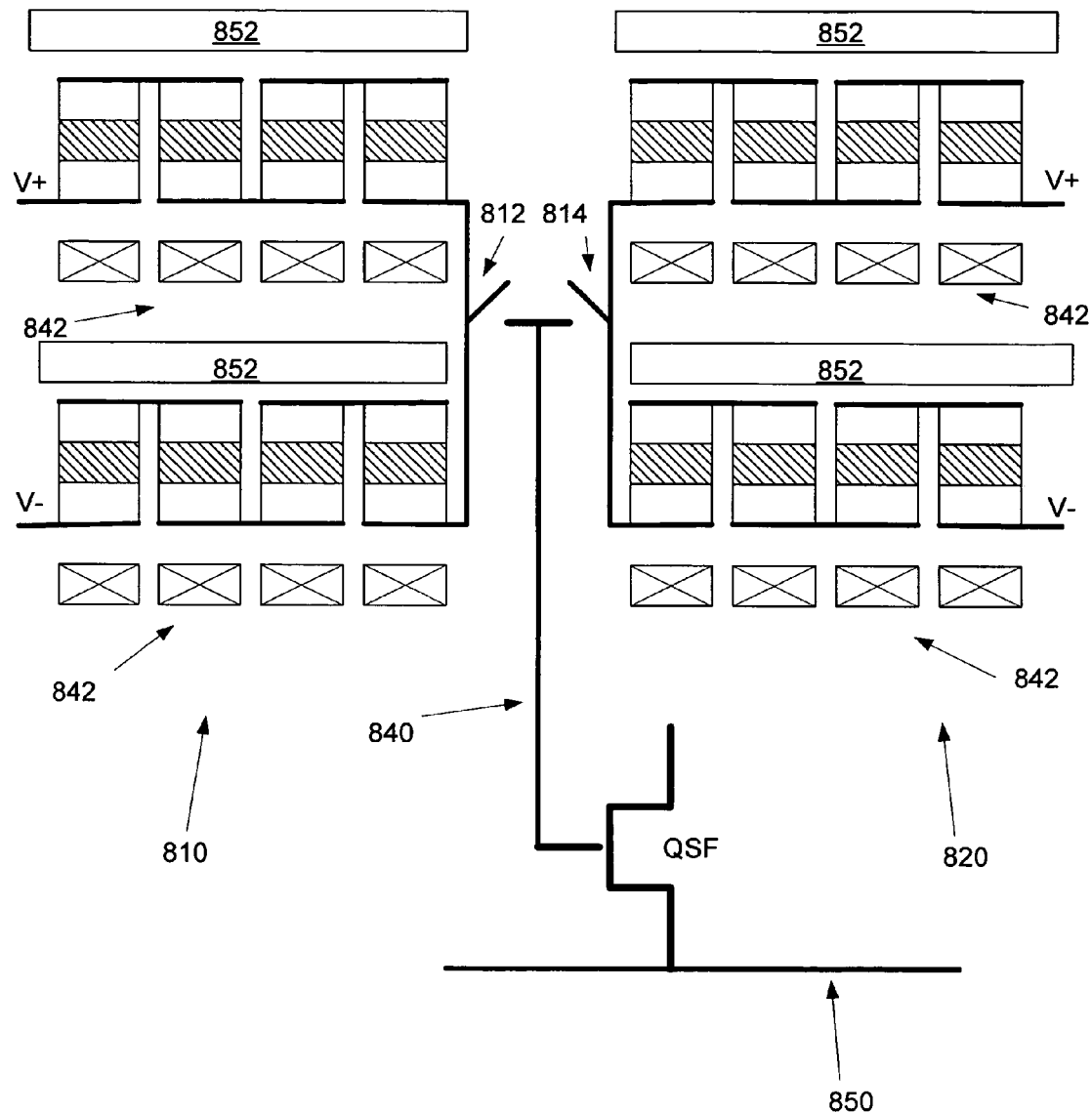
FIG. 8 is shows an embodiment of an MRAM device that includes multiple layers.

FIG. 8 is shows an embodiment of an MRAM device that includes multiple layers. The previously described MRAM cells located within strings of MRAM cells are ideally suited for stacking of MRAM cells over multiple layers. This is desirable because of the potential for greatly reducing the size (substrate area) needed to fabricate an array of MRAM memory. The embodiment of FIG. 8 an exemplary. That is, many other possible multiple layer configurations are possible.

FIG. 8 shows a first string of MRAM cells 810 and a second string of MRAM cells 820 located on two different layers. A voltage divider string center point of the first string of MRAM cells 810 is controllably connectable to read bit line 850 through a first switch 812 and a source follower QSF. A voltage divider string center point of the second string of MRAM cells 820 is also controllably connectable to the read bit line 850 through a second switch 814 and the source follower QSF.

The switches 812, 814 can be fabricated in a substrate with other memory control circuitry, or the switches can be formed in the MRAM layers. The switches can be formed as switching diodes, or as switching transistors. The MRAM cells within the strings of MRAM cells 810, 820 can be individually written to through write word lines 842 and write bit lines 852.

The multiple layers of FIG. 8 can be formed over a substrate that includes control circuitry for the first string of MRAM cells 810 and the second string of MRAM cells 820. The first layer is formed over the substrate, and the second layer is formed over the first layer using standard semiconductor processing.

FIG. 9 is a flow chart showing steps included within a method of reading an MRAM cell. The MRAM cell is included within one of many strings of MRAM cells. A first step 910 of the method includes electrically connecting a voltage divider string center point of the plurality of strings of MRAM cells that includes the MRAM cell to a read line. The electrical connection can include a thin film transistor or a diode switching device. A second step 920 includes applying a first voltage potential to a first string of MRAM cells, and a second voltage to a second string of MRAM cells. A third step 930 includes sensing through the read line connected to the voltage divider string center point, an initial state of the MRAM cell. A fourth step 940 includes writing a known state to the MRAM cell. A fifth step 950 includes sensing through the read line, the known state of the MRAM cell. A sixth step 960 includes determining the state of the MRAM cell by comparing the sensed initial state the MRAM cell with the sensed known state of the MRAM cell. A seventh step 970 includes writing back the initial state of the MRAM cell, restoring its initial state.

Although specific embodiments of the invention have been described and illustrated, the invention is not to be limited to the specific forms or arrangements of parts so described and illustrated. The invention is limited only by the appended claims.

What is claimed:

1. A memory device, comprising:
   a first string of MRAM cells including a plurality of MRAM cells connected in series;
   a second string of MRAM cells including a plurality of MRAM cells connected in series; and
   a common connection controllably connectable to one end of the first string of MRAM cells, and to one end of the second string of MRAM cells;
   wherein the first string of MRAM cells and the second string of MRAM cells are electrically connectable to the common connection through diode switch devices.

2. The memory device of claim 1 wherein the diode switch devices are located in a substrate.

3. The memory device of claim 1 wherein the diode switch devices are turned on by setting voltage potentials at ends of the first string of MRAM cells and the second string of MRAM cells.

4. A memory device, comprising:
   a first layer of MRAM memory cells arranged in accordance with an MRAM architecture compatible with a voltage divider read circuit;
   a second layer of MRAM memory cells that is fabricated over the first layer of MRAM memory cells and arranged in accordance with an MRAM architecture compatible with a voltage divider read circuit; and
   a common connection associated with the first layer of MRAM memory cells and the second layer of MRAM memory cells that is controllably connectable to voltage divider string center points of the first layer of MRAM memory cells and second layer of MRAM memory cells;
   wherein the common connection is controllably connectable to the voltage divider string center points through diode switch devices.

5. An integrated circuit memory device, comprising:
first and second voltage divider strings of MRAM cells;
a first switch configured to connect a node in the first voltage divider string of MRAM cells to a common connection in response to a first voltage divider string control signal; and
a second switch configured to connect a node in the second voltage divider string of MRAM cells to the common connection in response to a second voltage divider string control signal.

6. The memory device of claim 5, wherein the node of the first voltage divider string is a center point of the first voltage divider string; and wherein the node of the second voltage divider string is a center point of the second voltage divider string.

7. The memory device of claim 5, further comprising:
a reference string of MRAM cells having a first end electrically connected to the common connection.

8. The memory device of claim 7, wherein the node of the first voltage divider string is a first end of the first voltage divider string; and wherein the node of the second voltage divider string is a first end of the second voltage divider string.

9. The memory device of claim 8, wherein a second end of the reference string is electrically connected to a lower voltage potential; and wherein a second end of the first voltage divider string is electrically connected to a power supply potential.

10. An integrated circuit memory device, comprising:
first and second voltage divider strings of MRAM cells;
a first diode having a first terminal electrically connected to a node of said first voltage divider string;
a second diode having a first terminal electrically connected to a node of said second voltage divider string and a second terminal electrically connected to a second terminal of said first diode; and
a reference string of MRAM cells electrically connected to the second terminals of said first and second diodes.

11. The memory device of claim 10, wherein the first terminals of said first and second diodes are anodes; and wherein said reference string of MRAM cells comprises a diode having an anode electrically connected to the second terminals of said first and second diodes.

* * * * *